(12) United States Patent
Park

(10) Patent No.: US 7,435,666 B2
(45) Date of Patent: Oct. 14, 2008

(54) EPITAXIAL GROWTH METHOD

(75) Inventor: Sung-soo Park, Seongnam-si (KR)

(73) Assignee: Samsung Corning Co., Ltd., Suwon-si (KR)

( * ) Notice: Subject to any disclaimer, the term of this patent is extended or adjusted under 35 U.S.C. 154(b) by 296 days.

(21) Appl. No.: 11/333,211

(22) Filed: Jan. 18, 2006

(65) Prior Publication Data
US 2006/0160334 A1    Jul. 20, 2006

(30) Foreign Application Priority Data
Jan. 19, 2005    (KR) ...................... 10-2005-0005024

(51) Int. Cl.
*H01L 21/36* (2006.01)
(52) U.S. Cl. .................. 438/479; 438/481; 257/E21.09
(58) Field of Classification Search .................. 438/478, 438/481; 257/E21.09
See application file for complete search history.

(56) References Cited

U.S. PATENT DOCUMENTS

| 6,495,852 B1 * | 12/2002 | Mouri ......................... 257/21 |
| 6,579,359 B1 | 6/2003 | Mynbaeva et al. |
| 6,861,729 B2 * | 3/2005 | Kozaki et al. ................ 257/623 |
| 6,924,159 B2 * | 8/2005 | Usui et al. ..................... 438/22 |
| 7,052,979 B2 * | 5/2006 | Nagai et al. ................. 438/478 |
| 2004/0152321 A1 * | 8/2004 | Gehrke et al. ............... 438/689 |
| 2004/0183090 A1 * | 9/2004 | Kitaoka et al. .............. 257/103 |
| 2005/0051766 A1 * | 3/2005 | Stokes et al. .................. 257/17 |
| 2006/0154451 A1 * | 7/2006 | Park ........................... 438/479 |

FOREIGN PATENT DOCUMENTS

JP    2001-223165    8/2001

OTHER PUBLICATIONS

Korean Office Action (with English translation) dated Mar. 29, 2006.

* cited by examiner

*Primary Examiner*—Scott B. Geyer
*Assistant Examiner*—Seahvosh J Nikmanesh
(74) *Attorney, Agent, or Firm*—McDermott Will & Emery LLP

(57) ABSTRACT

Provided is an epitaxial growth method for forming a high-quality crystalline growth semiconductor wafer. The method includes forming a buffer layer on a single crystalline wafer using a single crystalline material; forming a mask layer on the buffer layer; forming a plurality of holes in the mask layer using a laser to expose portions of the buffer layer; forming wells having a predetermined depth in the exposed portions of the buffer layer by injecting an etchant into the holes; removing the mask layer and annealing the buffer layer to form a porous buffer layer having cavities obtained by the wells; and forming a crystalline material layer on the porous buffer layer using an epitaxial growth process.

16 Claims, 4 Drawing Sheets

EPITAXIAL GROWTH METHOD

CROSS-REFERENCE TO RELATED PATENT APPLICATION

Priority is claimed to Korean Patent Application No. 10-2005-0005024, filed on Jan. 19, 2005, in the Korean Intellectual Property Office, the disclosure of which is incorporated herein in its entirety by reference.

BACKGROUND OF THE INVENTION

1. Field of the Invention

The present invention relates to an epitaxial growth method and more particularly, to a GaN epitaxial growth method.

2. Description of the Related Art

A substrate on which an epitaxial layer is formed using an epitaxial growth method may be bent and many crystalline defects may arise in the epitaxial layer due to lattice mismatch and a difference in coefficient of thermal expansion between the substrate and the epitaxial layer. Thus, it is necessary to overcome the above-described problems while forming a single crystalline semiconductor material layer using the epitaxial growth method.

U.S. Pat. No. 6,579,359 discloses a technique of using a porous buffer layer that absorbs internal stress. In this technique, the porous buffer layer is formed on a SiC substrate, and a crystalline layer is formed on the porous buffer layer. Since the buffer layer is porous, it absorbs stress induced by lattice mismatch.

However, since the porous buffer layer is formed using an anodization process, a conductive substrate should be employed, thus only limited kinds of materials may be used for the substrate. Also, the anodization method is very complicated and costly.

SUMMARY OF THE INVENTION

The present invention provides a method of forming a semiconductor crystalline layer at low cost by easily forming a porous buffer layer.

According to an aspect of the present invention, there is provided an epitaxial growth method including forming a buffer layer on a single crystalline wafer using a single crystalline material; forming a mask layer on the buffer layer; forming a plurality of holes in the mask layer using a laser to expose portions of the buffer layer; forming wells having a predetermined depth in the exposed portions of the buffer layer by injecting an etchant into the holes; removing the mask layer and annealing the buffer layer to form a porous buffer layer having cavities obtained by the wells; and forming a crystalline material layer on the porous buffer layer using an epitaxial growth process.

In the present invention, the crystalline material layer may be formed of a group III nitride semiconductor.

Also, the single crystalline wafer may be formed of one of Si, GaAs, SiC, GaN, and $Al_2O_3$. Preferably, the single crystalline wafer is formed of $Al_2O_3$, and the buffer layer and the crystalline material layer are formed of the same kind of material, specifically, GaN.

In another embodiment, the mask layer may be a photoresist layer.

The crystalline material layer may be formed using a vapor deposition process, specifically, one of a halide or hydride vapor phase epitaxy (HVPE) process, a metal organic chemical vapor deposition (MOCVD), and a molecular beam epitaxy (MBE) process.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

An epitaxial growth method according to the present invention will now be described more fully hereinafter with reference to the accompanying drawings, in which exemplary embodiments of the invention are shown.

Figure 1:
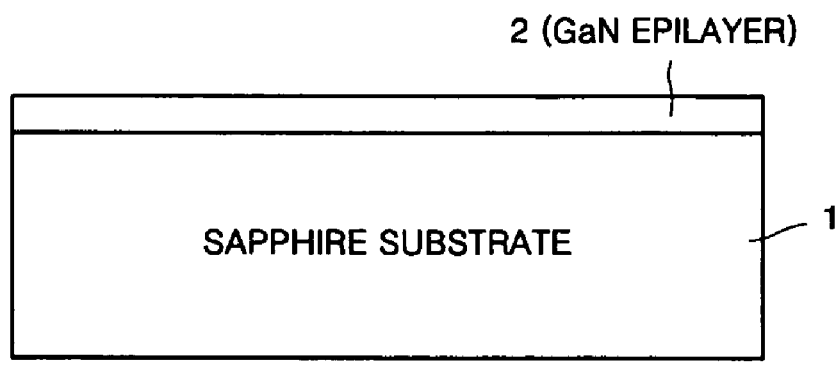
FIGS. 1 through 6 are cross sectional views illustrating an epitaxial growth method according to an exemplary embodiment of the present invention.

Referring to FIG. 1, a buffer layer 2 is formed on a prepared single crystalline wafer 1 using a single crystalline semiconductor layer (e.g., a group III nitride semiconductor layer, specifically, a GaN crystalline layer for example). In this case, the single crystalline wafer 1 may be formed of, for example, Si, GaAs, SiC, GaN, or $Al_2O_3$ (sapphire). Also, the buffer layer 2 may be formed by stacking a material of the same kind as the material of the wafer 1. For example, the buffer layer 2 may be formed by growing a GaN crystalline layer on a GaN wafer. Alternatively, the buffer layer 2 may be formed by stacking a material of a different kind from the material of the wafer 1. For example, the buffer layer 2 may be formed by growing a GaN crystalline layer on an $Al_2O_3$ wafer.

Specifically, to form the GaN buffer layer 2, the $Al_2O_3$ wafer 1 is loaded in a halide or hydride vapor phase epitaxy (HVPE) reactor, and an internal temperature of the reactor is raised to a growth temperature of about 1050° C.

Thereafter, a group III material and a group IV material, namely, GaCl and $NH_3$, are mixed with $N_2$ gas in a ratio of 1:20, and the mixture is injected into the reactor for about 3 minutes so that a GaN layer (i.e., the buffer layer 2) is grown on the $Al_2O_3$ wafer 1 to a thickness of 2 to 3 μm. After that, the reactor is cooled to a room temperature, and the $Al_2O_3$ wafer 1 on which the buffer layer 2 is formed is unloaded from the reactor.

Figure 2:
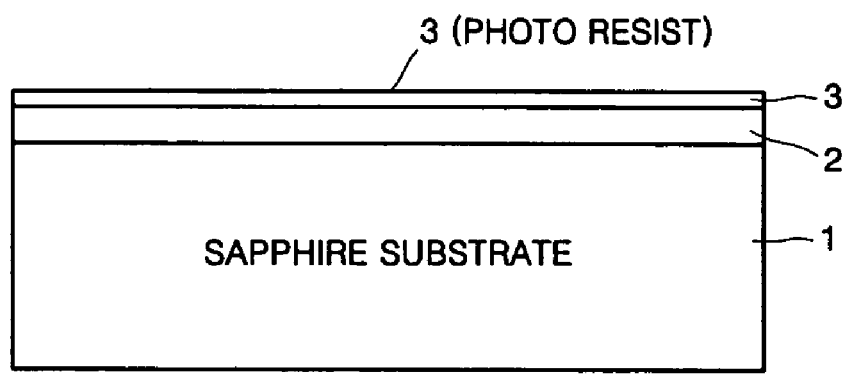

Referring to FIG. 2, a mask layer 3 is formed on the buffer layer 2. The mask layer 3 may be formed of photoresist using a spin coating process.

Figure 3:
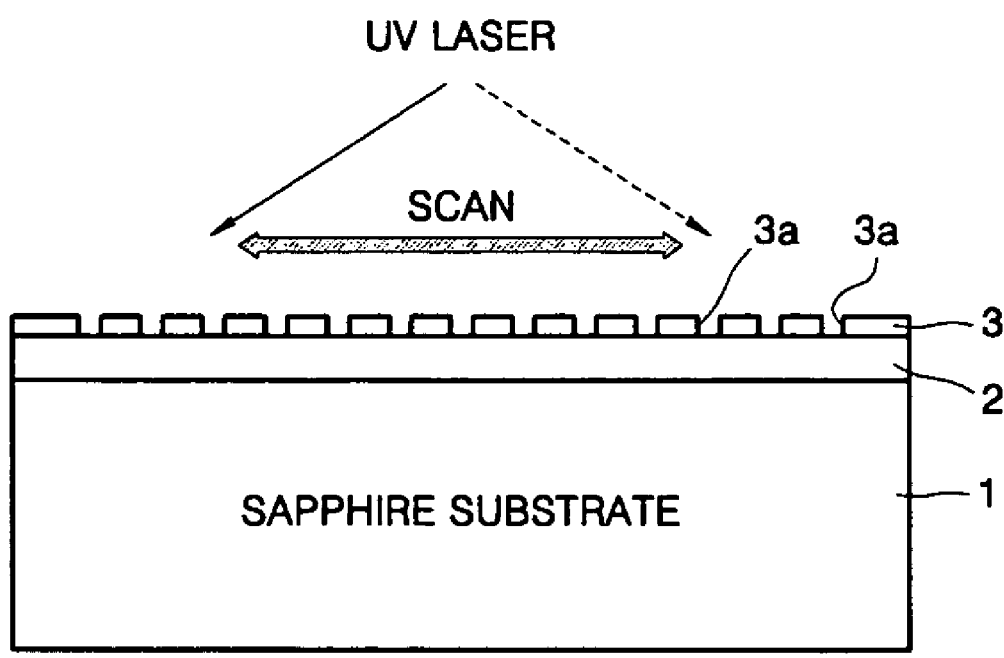

Referring to FIG. 3, a plurality of holes 3a are formed in the mask layer 3 formed of photoresist using an ultraviolet (UV) apparatus with a galvanometer, for instance. In this case, the holes 3a may be formed to a diameter of several tens of nm.

Figure 4:
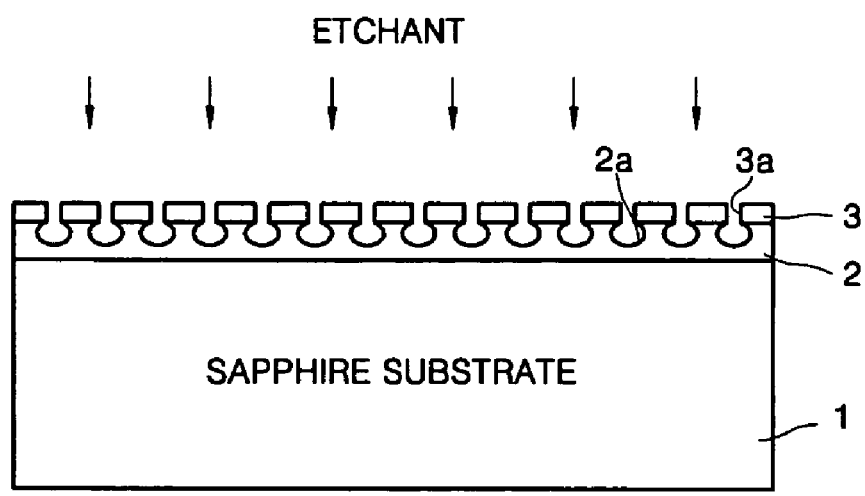

Referring to FIG. 4, wells 2a are formed to a predetermined depth in an upper portion of the buffer layer 2 through an etching process. In order to form the wells 2a, the etching process makes use of an etchant having a higher etch rate with respect to the GaN buffer layer 2 than the mask layer 3. As a result, portions of the buffer layer 2, which are not covered with the mask layer 3, are etched at a high rate during the etching process. In this case, the etching process is performed until the wells 2a have a diameter and depth of several tens of nm.

Figure 5:
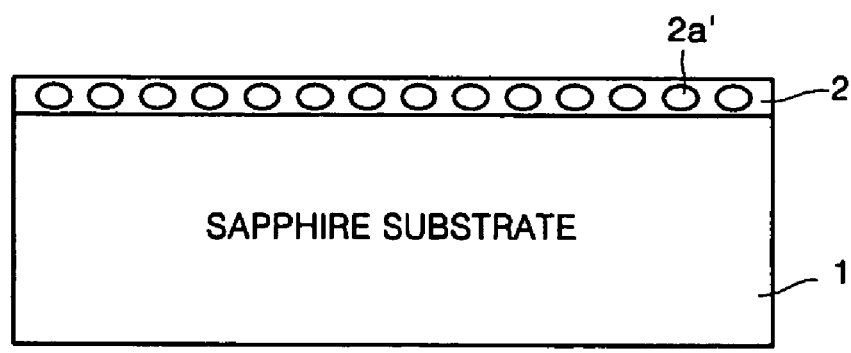

Referring to FIG. 5, after the wells 2a are formed, the mask layer 3 is stripped. Then, the buffer layer 2 is annealed using a rapid thermal annealing (RTA) process. For this process, the $Al_2O_3$ wafer 1 is loaded in a furnace that is maintained in an $NH_3$ atmosphere and then annealed at a temperature of 850° C. or higher. As a result, the wells 2a formed in the surface of the buffer layer 2 are mostly shut so that cavities 2a' buried in the buffer layer 2 are obtained. Thus, the surface of the buffer layer 2 is flattened.

Figure 6:
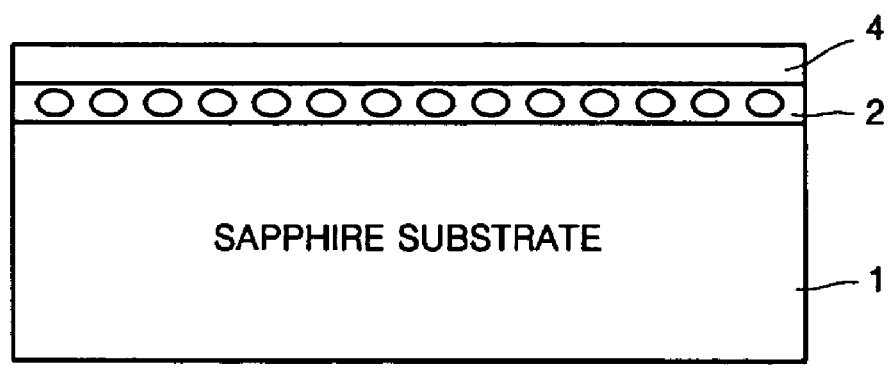

Referring to FIG. 6, a desired crystalline material layer 4 is formed on the buffer layer 2 using a typical epitaxial growth process. The crystalline material layer 4 may be formed of a material of the same kind as or a different kind from the underlying buffer layer 2. Preferably, the crystalline material layer 4 may be formed of a group III nitride semiconductor, for example, GaN, on the GaN buffer layer 2. In this case, the $Al_2O_3$ wafer 1 is loaded in the HVPE reactor, a reaction between HCl and Ga occurs, thus generating GaCl, and a reaction between GaCl and $NH_3$ gas occurs, thus growing the GaN crystalline material layer 3 to a thickness of several μm on the surface of the GaN buffer layer 2. During the epitaxial growth process, process conditions are controlled such that epitaxial growth rate measured in a horizontal direction is higher than epitaxial growth rate measured in a vertical direction.

Once the epitaxial growth process is finished, the HVPE reactor is cooled to a room temperature, and the $Al_2O_3$ wafer 1, on which the GaN semiconductor crystalline material layer 3 is grown, is unloaded from the HVPE reactor.

When a GaN crystalline material layer was actually formed through the above-described processes, the following measurements were obtained. The GaN crystalline material layer had a defect density of about $5 \times 10^7 /cm^2$ that is less than a conventional defect density of $5 \times 10^9 /cm^2$ and had about ⅕ of a strain stress of a conventional GaN layer, as described above.

An optical device may be directly formed on the wafer 1 that has undergone the above-described processes. Alternately, to obtain a freestanding GaN wafer, the $Al_2O_3$ wafer 1 may be loaded in the HVPE reactor and another GaN crystalline material layer may be further grown on the GaN crystalline material layer 4 to a thickness of about 300 μm or more. Subsequently, the $Al_2O_3$ wafer 1 may be removed using a known laser lift-off process, thus achieving a high-quality freestanding GaN wafer having a defect density of about $5 \times 10^5 /cm^2$.

According to embodiments of the present invention, a crystalline material layer having a porous buffer layer is formed on a single crystalline wafer using an etching process. In particular, a mask layer is formed on the wafer to obtain the crystalline material layer having the porous buffer layer. Since the porous buffer layer is formed using an etching process and an annealing process, the wafer can be formed of a wide variety of materials.

Also, embodiments of the present invention can reduce the defect density, stress, and bending degree of an epitaxial growth substrate, thus enabling formation of a high-quality semiconductor wafer and increasing yield. Further, owing to improvements in the above-described physical properties, an epitaxial growth semiconductor wafer can be formed to a greater diameter.

In addition, embodiments of the present invention are appropriate for a single crystalline semiconductor wafer that is formed dependently upon another substrate, for example, a group III nitride semiconductor wafer such as a GaN wafer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An epitaxial growth method comprising the following steps carried out in sequential order:
   forming a buffer layer on a single crystalline wafer using a single crystalline material;
   forming a mask layer on the buffer layer;
   forming a plurality of holes in the mask layer to expose portions of the buffer layer;
   forming wells having a predetermined depth in the exposed portions of the buffer layer by injecting an etchant into the holes;
   removing the mask layer and annealing the buffer layer to form a porous buffer layer having cavities obtained by the wells; and
   forming a crystalline material layer on the porous buffer layer using an epitaxial growth process.

2. The method according to claim 1, wherein the crystalline material layer is formed of a group III nitride semiconductor.

3. The method according to claim 2, wherein the single crystalline wafer is formed of $Al_2O_3$, and the buffer layer and the crystalline material layer are formed of GaN.

4. The method according to claim 1, wherein the single crystalline wafer is formed of one selected from the group consisting of Si, GaAs, SiC, GaN, and $Al_2O_3$.

5. The method according to claim 4, wherein the single crystalline wafer is formed of $Al_2O_3$, and the buffer layer and the crystalline material layer are formed of GaN.

6. The method according to claim 1, wherein the single crystalline wafer is formed of $Al_2O_3$, and the buffer layer and the crystalline material layer are formed of GaN.

7. The method according to claim 6, wherein the mask layer is formed of photoresist.

8. The method according to claim 1, wherein the mask layer is formed of photoresist.

9. The method according to claim 1, wherein the mask layer is formed of a material having a lower etch rate than the buffer layer.

10. The method according to claim 1, wherein the crystalline material layer is formed using a vapor deposition process.

11. The method according to claim 10, wherein the vapor deposition process is one selected from the group consisting of a halide or hydride vapor phase epitaxy (HVPE) process, a metal organic chemical vapor deposition (MOCVD), and a molecular beam epitaxy (MBE) process.

12. The method according to claim 1, wherein the annealing of the buffer layer is performed at a temperature of 850° C. or higher.

13. A semiconductor structure resulting from the method of claim 1.

14. An epitaxial growth method comprising:
   forming a buffer layer on a single crystalline wafer using a single crystalline material;
   forming a mask layer on the buffer layer;
   forming a plurality of holes in the mask layer to expose portions of the buffer layer;
   forming wells having a predetermined depth in the exposed portions of the buffer layer by injecting an etchant into the holes;
   removing the mask layer and annealing the buffer layer to form a porous buffer layer having cavities obtained by the wells; and
   forming a crystalline material layer on the porous buffer layer using an epitaxial growth process, wherein the plurality of holes in the mask layer are formed using a laser.

15. The method according to claim 14, wherein the single crystalline wafer is formed of $Al_2O_3$, and the buffer layer and the crystalline material layer are formed of GaN.

16. A semiconductor structure resulting from the method of claim 14.

* * * * *